United States Patent [19]
Mattfeld

[11] Patent Number: 4,879,522
[45] Date of Patent: Nov. 7, 1989

[54] INTEGRATED COMPLEMENTARY PUSH-PULL B FINAL STAGE

[75] Inventor: Johann Mattfeld, Obersulm, Fed. Rep. of Germany

[73] Assignee: Telefunken electronic GmbH, Heilbronn, Fed. Rep. of Germany

[21] Appl. No.: 231,528

[22] Filed: Aug. 12, 1988

[30] Foreign Application Priority Data

Aug. 22, 1987 [DE] Fed. Rep. of Germany ....... 3728078

[51] Int. Cl.$^4$ .............................................. H03F 3/26
[52] U.S. Cl. .................................... 330/263; 330/267
[58] Field of Search ............... 330/263, 269, 267, 268, 330/307, 310, 311

[56] References Cited

U.S. PATENT DOCUMENTS

| | | | |
|---|---|---|---|
| 3,988,691 | 10/1976 | Shih | 330/267 |
| 4,041,411 | 8/1977 | Sturgeon | 330/265 X |
| 4,160,216 | 7/1979 | Thorntow | 330/267 |
| 4,431,972 | 2/1984 | Ishii et al. | 330/267 |

FOREIGN PATENT DOCUMENTS 2554770 12/1984 Fed. Rep. of Germany.
2410906  6/1979 France.

OTHER PUBLICATIONS

"Halbleiter-Schaltungstechnik"; Springer-VeRlag . . . 1980, p. 371 and pp. 379–380.

*Primary Examiner*—Steven Mottola
*Attorney, Agent, or Firm*—Spencer & Frank

[57] ABSTRACT

To actuate a complementary push-pull class B final stage complementary driver transistors are provided whose emitters are electrically interconnected and connected to the collectors of the two final stage transistors via a filter section. This filter section is not integratable into the rest of the circuit on account of the high capacitance value of the capacitor. To permit design of this complementary push-pull class B final stage as an integrated circuit the filter section is replaced according to the invention by a circuit arranged between the emitters of the driver transistors and ground and having dynamic low impedance and being designed such that the operating voltage drops by about half across the integratable circuit.

4 Claims, 2 Drawing Sheets

INTEGRATED COMPLEMENTARY PUSH-PULL B FINAL STAGE

BACKGROUND OF THE INVENTION

The invention relates to a complementary push-pull class B final-stage having complementary driver transistors whose emitters are directly interconnected.

A transistor push-pull amplifier having a push-pull driver stage with two complementary transistors and a push-pull class B final-stage likewise containing two complementary transistors is known from DE-PS 25 54 770.

According to FIG. 2 of the above-mentioned publication, the complementary driver transistors whose emitters are directly interconnected are used to actuate this complementary push-pull class B final-stage. Since the DC voltage potential of these emitters is approximately half the operating voltage potential, the emitters can be connected to the link between the two collectors of the final-stage transistors. The connection of the two collectors of the final-stage transistors must have a DC voltage equal to half the operating voltage in order to achieve a high power output. To avoid amplification-reducing negative feedback, this connection is made via a filter section comprising one or two resistors and a capacitor.

This circuit array is not usable for integrated circuits since the capacitor of the filter section is not integratable on account of the high capacitance value (22 $\mu$F in the cited reference). Therefore the switching point between the filter section resistor(s) and the emitters of the driver transistors would have to be designed as a connection point, entailing additional costs.

SUMMARY OF THE INVENTION

The object of the invention is therefore to provide a complementary push-pull class B final stage of the type mentioned at the outset that is easily integratable.

According to the invention there is provided an integratable circuit arranged between the connected emitters of the driver transistors and the reference potential, said circuit having dynamic low impedance and being designed so that the operating voltage drops by about half through this circuit.

With the embodiment of the complementary push-pull class B final stage according to the invention, the requirement set forth above is met, giving an integrated circuit whose manufacture does not entail any unacceptable modification of the technology or require an additional connecting pin for an external capacitor.

The invention will be described in greater detail below with reference to an embodiment that is illustrated in the drawings.

DESCRIPTION OF THE PREFERRED EMBODIMENTS

Figure 1:
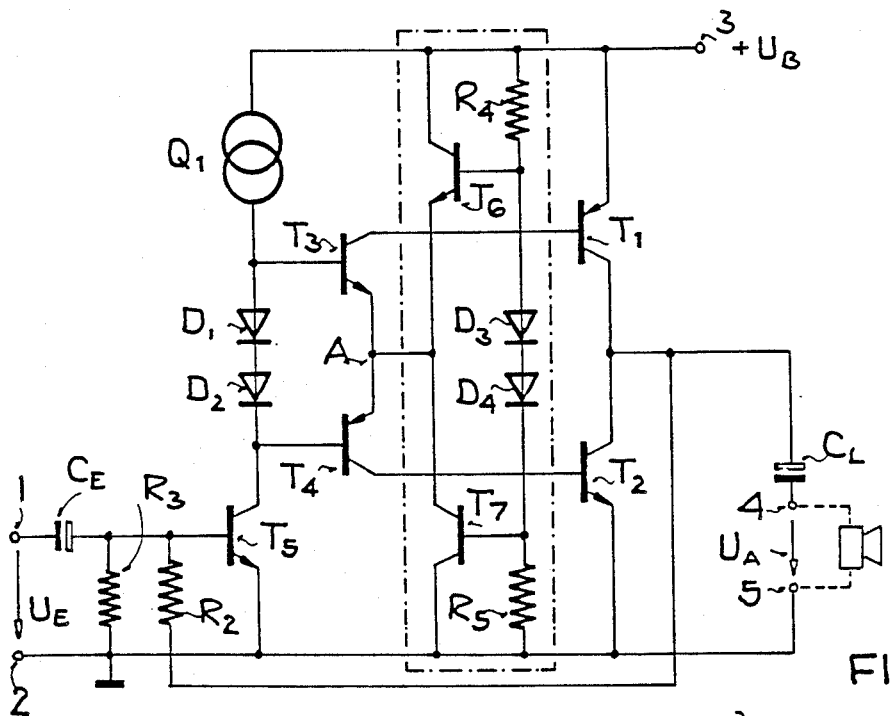
FIG. 1 is a schematic diagram illustrating an integratable complementary push-pull class B final stage circuit.

A first embodiment in accordance with the invention of an integratable complementary push-pull class B final stage according to FIG. 1 has two connections 1, 2 for supplying AC signals of voltage $U_E$ to be amplified by the amplifier. The connection 2 is grounded and connection 1 is linked to the base of a transistor $T_5$ via a capacitor $C_E$, the emitter of said transistor $T_5$ being connected to ground potential. The collector of said transistor $T_5$ is connected firstly to the base of a pnp-driver transistor $T_4$ and secondly to the base of an npn-driver transistor $T_3$ via diodes $D_1$ and $D_2$ connected in series and in the conducting direction as regards the operating voltage, such that the transistors $T_3$ and $T_4$ form a complementary push-pull driver stage whose emitters are directly interconnected (circuit-point A). The base of the driver transistor $T_3$ is in addition connected via a current source $Q_1$ to a connection 3 of an operating voltage source supplying a DC voltage $U_B$.

While the collectors of the transistors $T_1$ and $T_2$ are directly connected to one another, the collector of the driver transistor $T_3$ is connected to the base of the pnp-transistor $T_1$, and the collector of driver transistor $T_4$ to the base of the npn-transistor $T_2$. Transistors $T_1$ and $T_2$ constitute a complementary push-pull class B final stage, with the emitter of the final stage transistor $T_1$ being connected to the positive operating potential of connection 3 and the emitter of the final stage transistor $T_2$ being connected to ground potential.

The two interconnected collectors of the final stage transistors $T_1$ and $T_2$ are firstly connected to a connection 4 via a capacitor $C_L$, said connection constituting together with a connection 5 at ground potential the output of the push-pull final stage. Secondly, the connection point between the collectors of the final stage transistors $T_1$ and $T_2$ is connected to the base of the input transistor $T_5$ via a resistor $R_2$. A resistor $R_3$ is provided between the base of the input transistor and the reference potential. The capacitor $C_E$ is used for coupling the input signal $U_E$.

Besides the complementary transistors $T_3$ and $T_4$, and $T_1$ and $T_2$ which are in the driver stage and in the push-pull B final stage, respectively, the transistors $T_1$ and $T_3$, and $T_2$ and $T_4$ respectively are complementary to one another.

The portion described above of the complementary pushpull B final stage with a complementary driver transistor pair is known from the above reference.

As already mentioned above, the filter section known to the prior art and arranged between the connection point A of the emitters of the driver transistors $T_3$ and $T_4$ and the connection point of the collectors of the final-stage transistors $T_1$ and $T_2$ cannot be integrated. For that reason the known filter section is dispensed with, and, as shown in FIG. 1, replaced by an integratable circuit comprising a further complementary transistor pair $T_6$ and $T_7$ whose emitters are connected together and linked to the connection point A, while the collector of transistor $T_6$ is connected to the positive operating potential of connection 3 and the collector of transistor $T_7$ is connected to ground potential and while the base of transistor $T_6$ is connected via a resistor $R_4$ to the positive operating potential of connection 3, and the base of transistor $T_7$ via the resistor $T_5$ to the ground potential. Furthermore, the bases of transistors $T_6$ and $T_7$ are connected via two diodes $D_3$ and $D_4$ connected in series, thereby providing a voltage divider together with resistors $R_4$ and $R_5$. The identically sized resistors $R_4$ and $R_5$ ensure that the DC voltage at the emitter connection of transistors $T_6$ and $T_7$ corresponds to approximately half of the operating voltage. Also, the diodes $D_3$ and $D_4$ ensure that an adequately large DC current flows through the transistors $T_6$ and $T_7$. Furthermore, the required dynamic low-impedance resistance at the emitters of transistors $T_3$ and $T_4$ is ensured by the grounded-base circuit of transistors $T_6$ and $T_7$.

Figure 2:
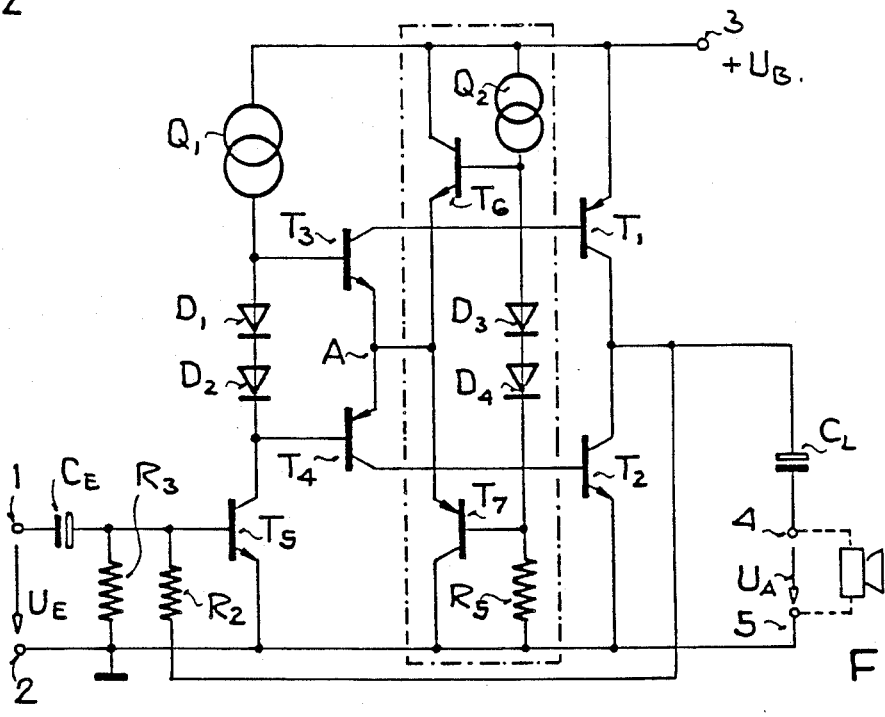
FIG. 2 is a schematic diagram of another embodiment of a complementary push-pull class B final stage circuit.

Since the integrated circuit of FIG. 1 in accordance with the invention is used in a large operating voltage range, the current is also changed by the voltage divider $R_4$, $R_5$, $D_3$ and $D_4$ to a corresponding extent, which may be considered a drawback under some circumstances. To avoid this drawback, the resistors $R_4$ or $R_5$ can in a further embodiment according to the invention be replaced by a power source $Q_2$, so that the quiescent current of the circuit is practically constant regardless of the operating voltage. The voltage at the connection point A of the emitters of transistors $T_3$, $T_4$, $T_6$ and $T_7$ then no longer corresponds to exactly half the operating voltage when the latter undergoes change, but is so designed that optimum operation is ensured in a generally adequate range of operating voltage changes. A circuit of this type, where the resistor $R_4$ is replaced by a voltage source $Q_2$, is shown in FIG. 2. In all other respects the circuit according to FIG. 2 corresponds to the circuit according to FIG. 1.

Figure 3:
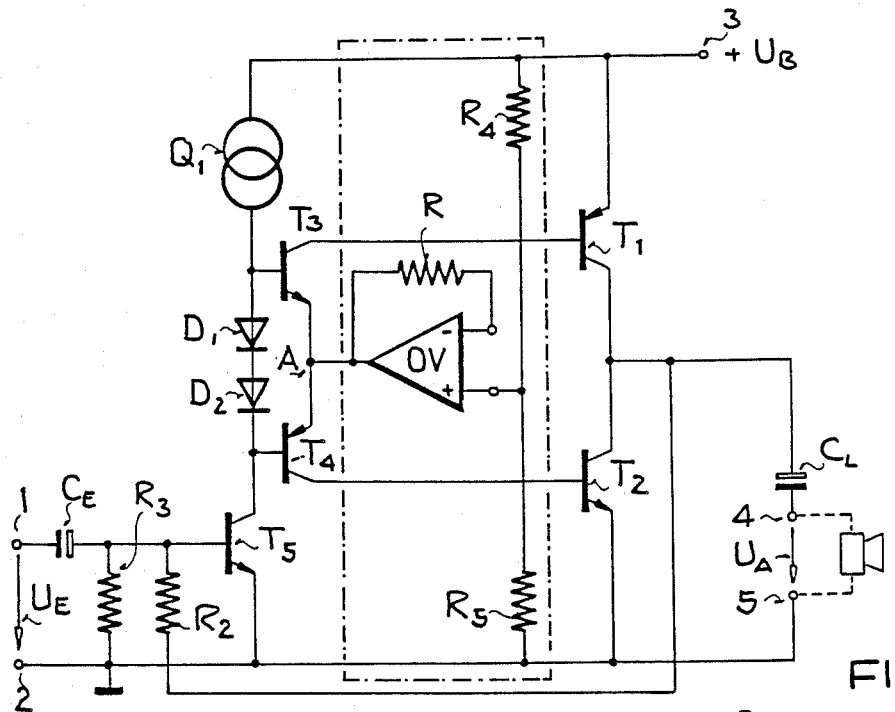
FIG. 3 is a schematic diagram of another embodiment of the push-pull class B final stage circuit according to the invention.

In a further advantageous embodiment of the invention the output of an operational amplifier OV is connected to the connection point A of the two emitters of driver transistors $T_3$ and $T_4$. This circuit is shown in FIG. 3, where the noninverting input of the operational amplifier OV is connected to a voltage divider comprising the identically sized resistors $R_4$ and $R_5$, and the inverting input of the operational amplifier connected to its output via a resistor R. In this way the output DC voltage of the operational amplifier OV corresponds to exactly half the operating voltage. Oscillations are avoided thanks to the heavy negative feedback through the resistor R. The dynamic output resistance of the integratable additional circuit from the operational amplifier OV and the voltage dividers $R_4$ and $R_5$ has very low impedance at the connection point A.

Figure 4:
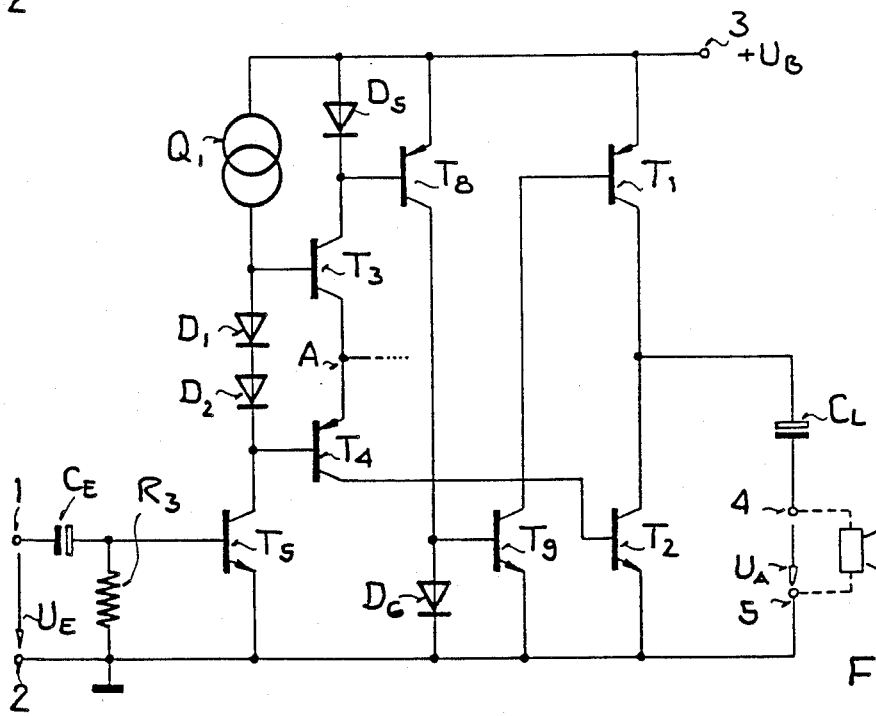
FIG. 4 is a schematic diagram of a further embodiment of the push-pull class B final stage circuit.

A further embodiment of the invention is shown in FIG. 4, where the base of the final stage transistor $T_1$ is actuated by a current-inverting circuit. This circuit can be used advantageously when current amplification of one of the two final stage transistors under high collector currents is low for technological reasons.

In accordance with FIG. 4, this current-inverting circuit comprises a pnp-transistor $T_8$ whose base is connected on the one hand to the collector of the driver transistor $T_3$ and on the other hand via a diode $D_5$ to the positive operating potential of the connection 3, and an npn-transistor $T_9$ whose base is firstly connected to the collector of transistor $T_8$ and secondly grounded via a diode $D_6$, whereas the collector is connected to the base of the final stage transistor $T_1$. The two emitters of transistors $T_8$ and $T_9$ are connected to the positive operating potential and to ground respectively, while the emitters of the two driver transistors $T_3$ and $T_4$ are directly interconnected via the connection point A.

The connection point A can now be connected to the two terminals of the operating voltage source using one of the embodiments of the integratable additional circuit according to the invention, with these embodiments being shown in the circuits in FIGS. 1 to 3 and relating in each case to that portion of the circuits which is between the connection point A and the two terminals of the operating voltage source and also in a rectangle indicated by the dash-dotted line. The actuation of the final stage transistor $T_1$ using the currentinverting circuit shown in FIG. 4 equalizes the usually lower current amplification of the pnp-final stage transistor $T_1$ in relation to the npn-final stage transistor $T_2$.

What is claimed is:

1. A complementary push-pull class B final stage having first and second complementary driver transistors and having third and fourth complementary driver transistors whose emitters are directly interconnected, wherein an integratable circuit is disposed between the connected emitters of the third and fourth driver transistors and an operating voltage, the integratable circuit having dynamic low impedance such that about half of the operating voltage drops across the integratable circuit, and wherein the integratable circuit includes:

(a) fifth and sixth complementary transistors whose emitters are connected together and linked to the connected emitters of the third and fourth complementary transistors, and whose collectors are connected respectively to first and second terminals of the operating voltage source,
   (b) a first resistor arranged between said first terminal of the operating voltage source and the base of the fifth transistor,
   (c) a second resistor disposed between the second terminal of the operating voltage source and the base of the sixth transistor, and
   (d) two diodes connected in series and oriented in the conducting direction with regard to the operating voltage, for connecting the bases of the fifth and sixth complementary transistors.

2. A complementary push-pull class B final stage having first and second complementary driver transistors and having third and fourth complementary driver transistors whose emitters are directly interconnected, wherein an integratable circuit is disposed between the connected emitters of the third and fourth driver transistors and an operating voltage source, the integratable circuit having dynamic low impedance such that about half of the operating voltage drops across the integratable circuit, and wherein the integrated circuit comprises:

(a) an operational amplifier having an output which is connected together with the connected emitters of the third and fourth complementary driver transistors and whose inverting input is connected to the output of the operational amplifier via a first resistor, and
   (b) two substantially identically sized second and third resistors connected in series across the terminals of the operating voltage source, and whose common connection is linked to the non-inverting input of the operational amplifier.

3. A complementary push-pull class B final stage having first and second complementary driver transistors and having third and fourth complementary driver transistors whose emitters are directly interconnected, wherein an integratable circuit is disposed between the connected emitters of the third and fourth driver transistors and an operating voltage source, the integratable circuit having dynamic low impedance such that about half of the operating voltage drops across the integratable circuit, and wherein the integratable circuit includes:
(a) fifth and sixth complementary transistors whose emitters are connected together and linked to the connected emitters of the third and fourth complementary transistors, and whose collectors are connected respectively to first and second terminals of the operating voltage source,
(b) one of a resistor and a current source arranged between the first terminal of the operating voltage source and the base of the fifth complementary transistor, and the other one of the resistor and the current source disposed between the second terminal of the operating voltage source and the base of the sixth complementary transistor, and
(c) two diodes connected in series and oriented in the conducting direction with regard to the operating voltage, for connecting the bases of the fifth and sixth complementary transistors.

4. A complementary push-pull class B final stage as claimed in claim 3, wherein the current source is disposed between the first terminal of the operating voltage source and the base of the fifth transistor, and the resistor is disposed between the second terminal of the operating voltage source and the base of the sixth transistor.

* * * * *